US009679641B2

(12) United States Patent
Russo et al.

(10) Patent No.: US 9,679,641 B2
(45) Date of Patent: *Jun. 13, 2017

(54) MEMORY CELLS HAVING A PLURALITY OF RESISTANCE VARIABLE MATERIALS

(71) Applicant: Micron Technology, Inc., Boise, ID (US)

(72) Inventors: Ugo Russo, Boise, ID (US); Andrea Redaelli, Casatenovo (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/245,249

(22) Filed: Aug. 24, 2016

(65) Prior Publication Data

US 2016/0365142 A1    Dec. 15, 2016

Related U.S. Application Data

(60) Continuation of application No. 14/596,293, filed on Jan. 14, 2015, now Pat. No. 9,449,683, which is a
(Continued)

(51) Int. Cl.
*G11C 11/00* (2006.01)
*G11C 13/00* (2006.01)
(Continued)

(52) U.S. Cl.
CPC ...... *G11C 13/0004* (2013.01); *G11C 11/5678* (2013.01); *G11C 13/003* (2013.01);
(Continued)

(58) Field of Classification Search
CPC ............ G11C 13/0004; G11C 13/0069; G11C 11/5678
(Continued)

(56) References Cited

U.S. PATENT DOCUMENTS 7,842,991 B2 * 11/2010 Cho .................... G11C 13/0007
257/298
7,863,594 B2 * 1/2011 Akinaga ................. H01L 45/04
257/2

(Continued)

FOREIGN PATENT DOCUMENTS

TW            200847420 A      12/2008

OTHER PUBLICATIONS

Servalli, "A 45nm Generation Phase Change Memory Technology," Dec. 7-9, 2009, 4 pages.
(Continued)

*Primary Examiner* — Connie Yoha
(74) *Attorney, Agent, or Firm* — Brooks, Cameron & Huebsch, PLLC

(57) ABSTRACT

Resistance variable memory cells having a plurality of resistance variable materials and methods of operating and forming the same are described herein. As an example, a resistance variable memory cell can include a plurality of resistance variable materials located between a plug material and an electrode material. The resistance variable memory cell also includes a first conductive material that contacts the plug material and each of the plurality of resistance variable materials and a second conductive material that contacts the electrode material and each of the plurality of resistance variable materials.

20 Claims, 10 Drawing Sheets

Related U.S. Application Data division of application No. 13/570,772, filed on Aug. 9, 2012, now Pat. No. 8,964,448.

(51) Int. Cl.
  *H01L 45/00* (2006.01)
  *G11C 11/56* (2006.01)

(52) U.S. Cl.
  CPC ........ *G11C 13/004* (2013.01); *G11C 13/0069* (2013.01); *H01L 45/06* (2013.01); *H01L 45/08* (2013.01); *H01L 45/1233* (2013.01); *H01L 45/14* (2013.01); *H01L 45/145* (2013.01); *H01L 45/16* (2013.01); *G11C 2013/008* (2013.01)

(58) Field of Classification Search
  USPC ............ 365/163, 161, 185.03; 256/2, 5, 298
  See application file for complete search history.

(56) References Cited

U.S. PATENT DOCUMENTS

| | | | |
|---|---|---|---|
| 8,437,173 B2 | 5/2013 | Hayakawa et al. | |
| 8,652,909 B2 | 2/2014 | Sills et al. | |
| 8,665,629 B2 | 3/2014 | Park et al. | |
| 8,964,448 B2* | 2/2015 | Russo | H01L 45/06 257/5 |
| 9,318,699 B2 | 4/2016 | Pellizzer et al. | |
| 9,449,683 B2* | 9/2016 | Russo | H01L 45/06 |
| 2006/0077706 A1 | 4/2006 | Li et al. | |
| 2006/0097239 A1 | 5/2006 | Hsiung | |
| 2006/0226411 A1* | 10/2006 | Lee | G11C 11/56 257/2 |
| 2009/0014706 A1 | 1/2009 | Lung | |
| 2009/0067230 A1 | 3/2009 | Koh et al. | |
| 2010/0051896 A1 | 3/2010 | Park et al. | |
| 2010/0237316 A1 | 9/2010 | Lung | |
| 2010/0308296 A1 | 12/2010 | Pirovano et al. | |
| 2011/0031465 A1 | 2/2011 | Mitani et al. | |
| 2011/0220863 A1 | 9/2011 | Mikawa et al. | |
| 2012/0252184 A1 | 10/2012 | Ninomiya et al. | |
| 2013/0146833 A1 | 6/2013 | Russo et al. | |
| 2013/0181183 A1 | 7/2013 | Pellizzer et al. | |
| 2014/0312293 A1 | 10/2014 | Mikawa et al. | |
| 2015/0109093 A1 | 4/2015 | Higano et al. | |

OTHER PUBLICATIONS

Bez, et al., "Status and Persepctive of Chalcogenide PCM in the Semiconductor Industry," Retrieved Jun. 21, 2012, 7 pages.

* cited by examiner

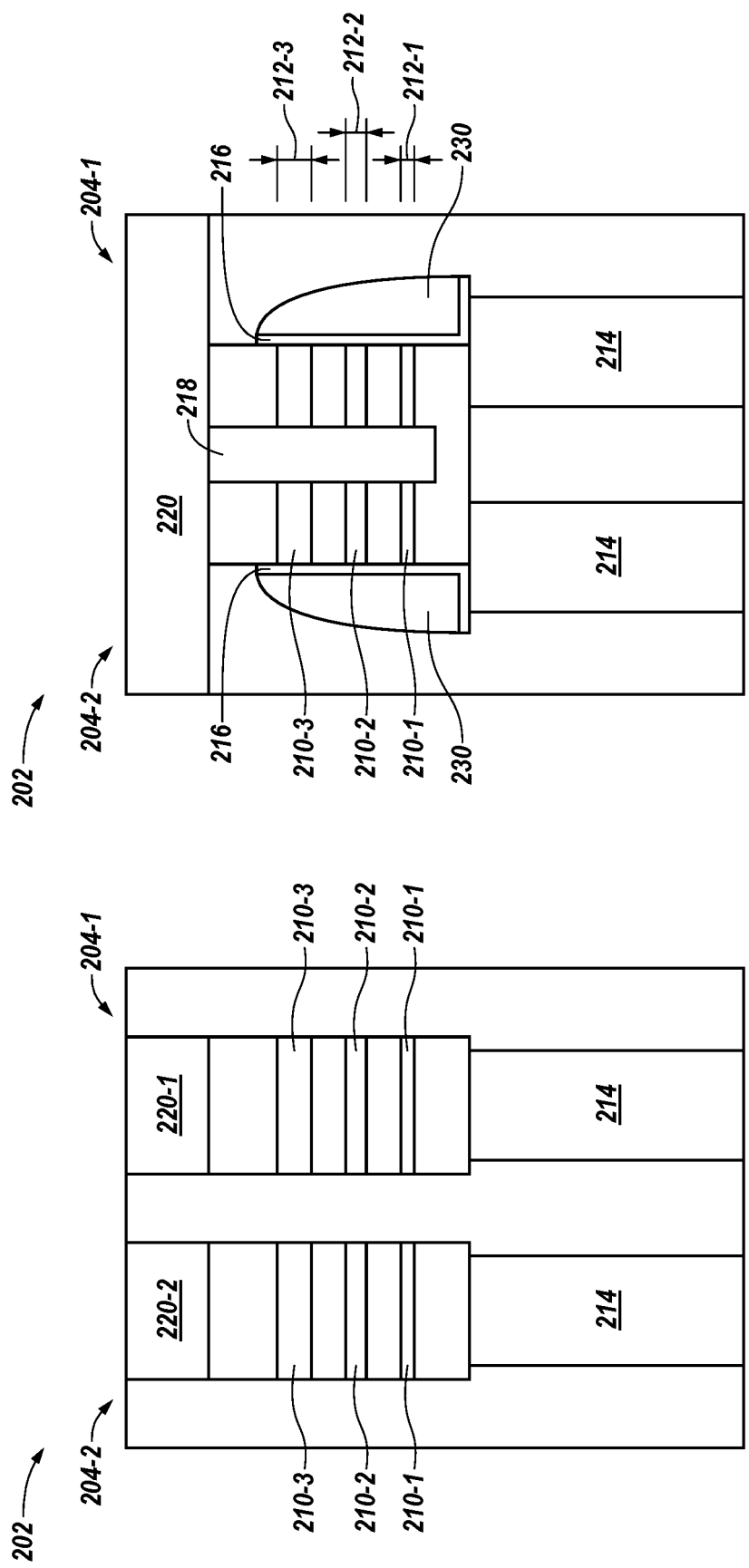

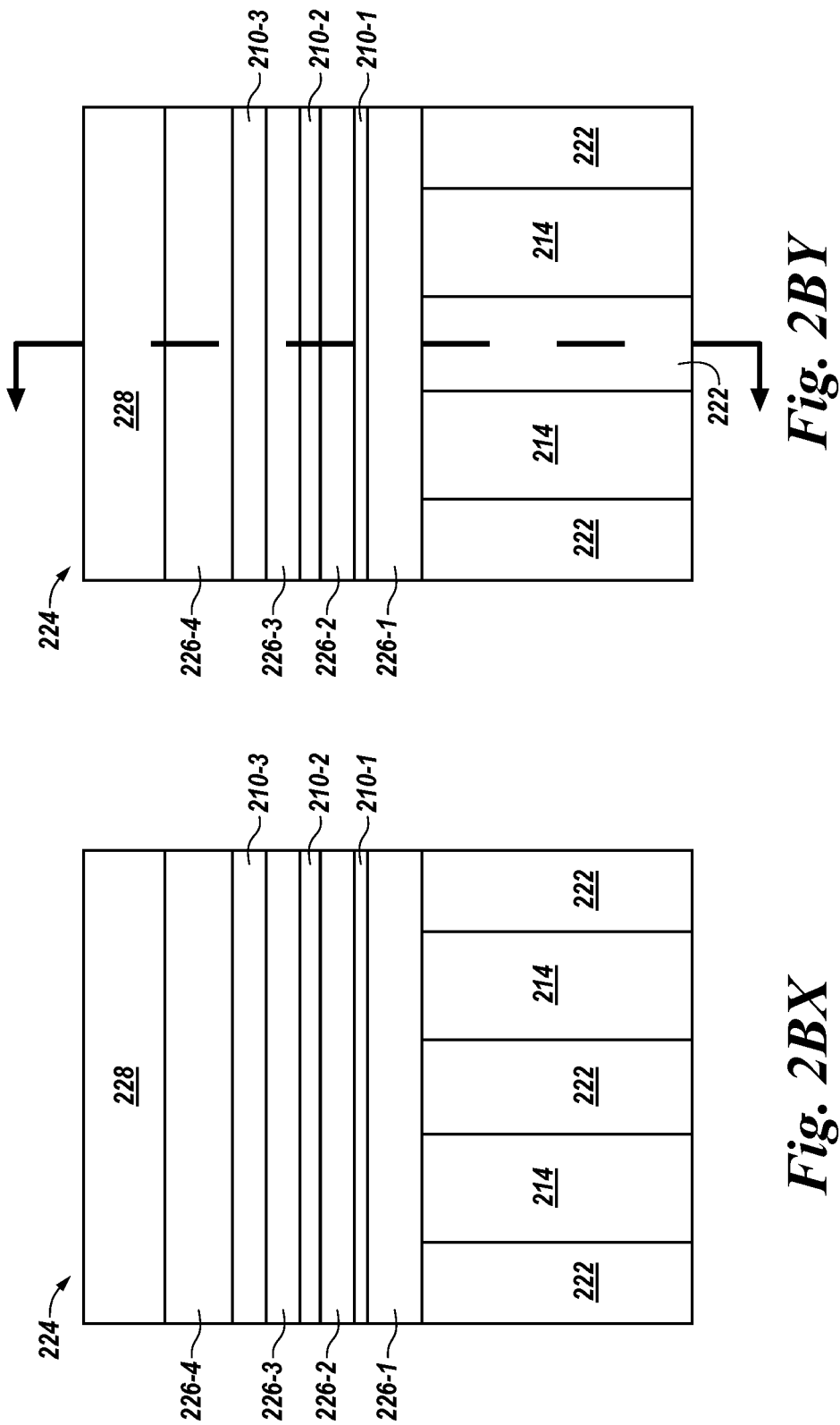

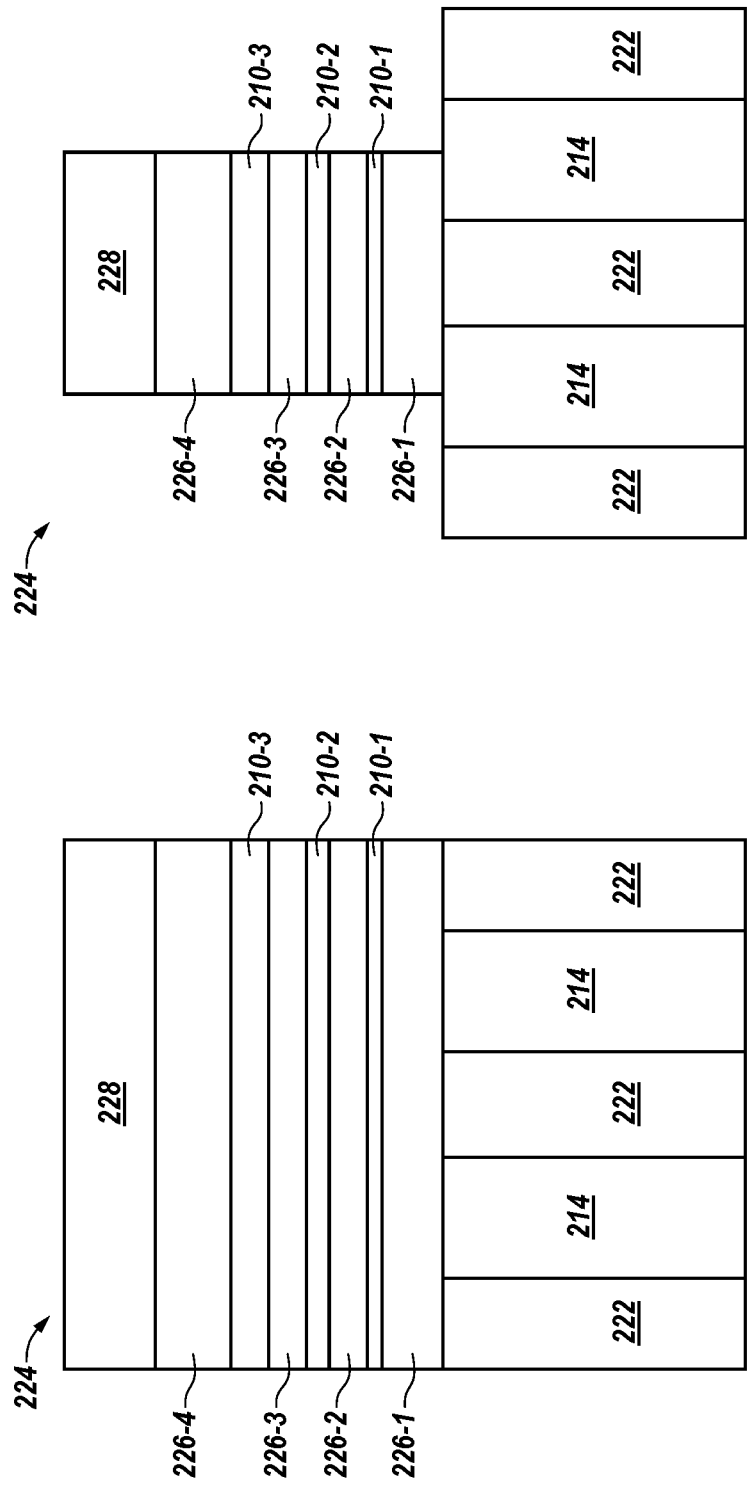

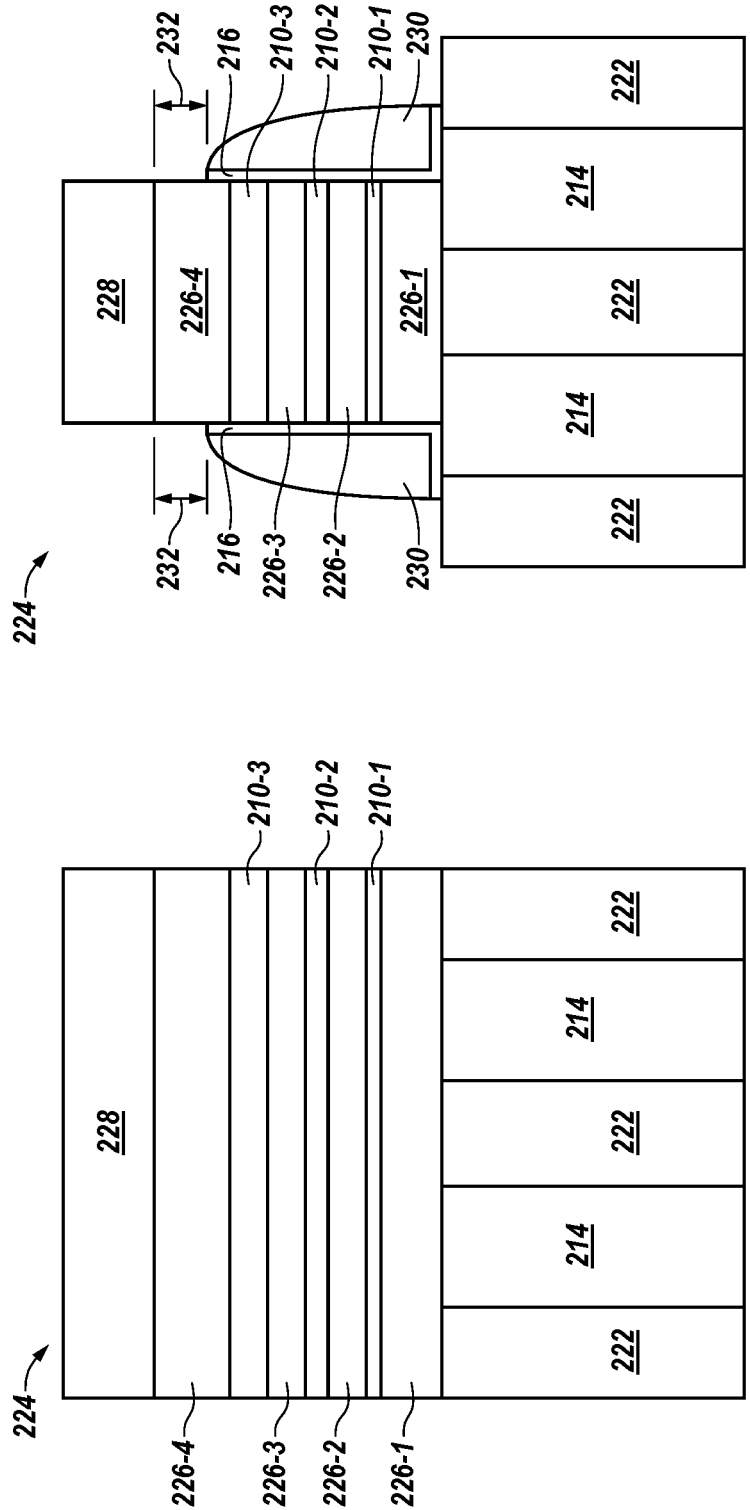

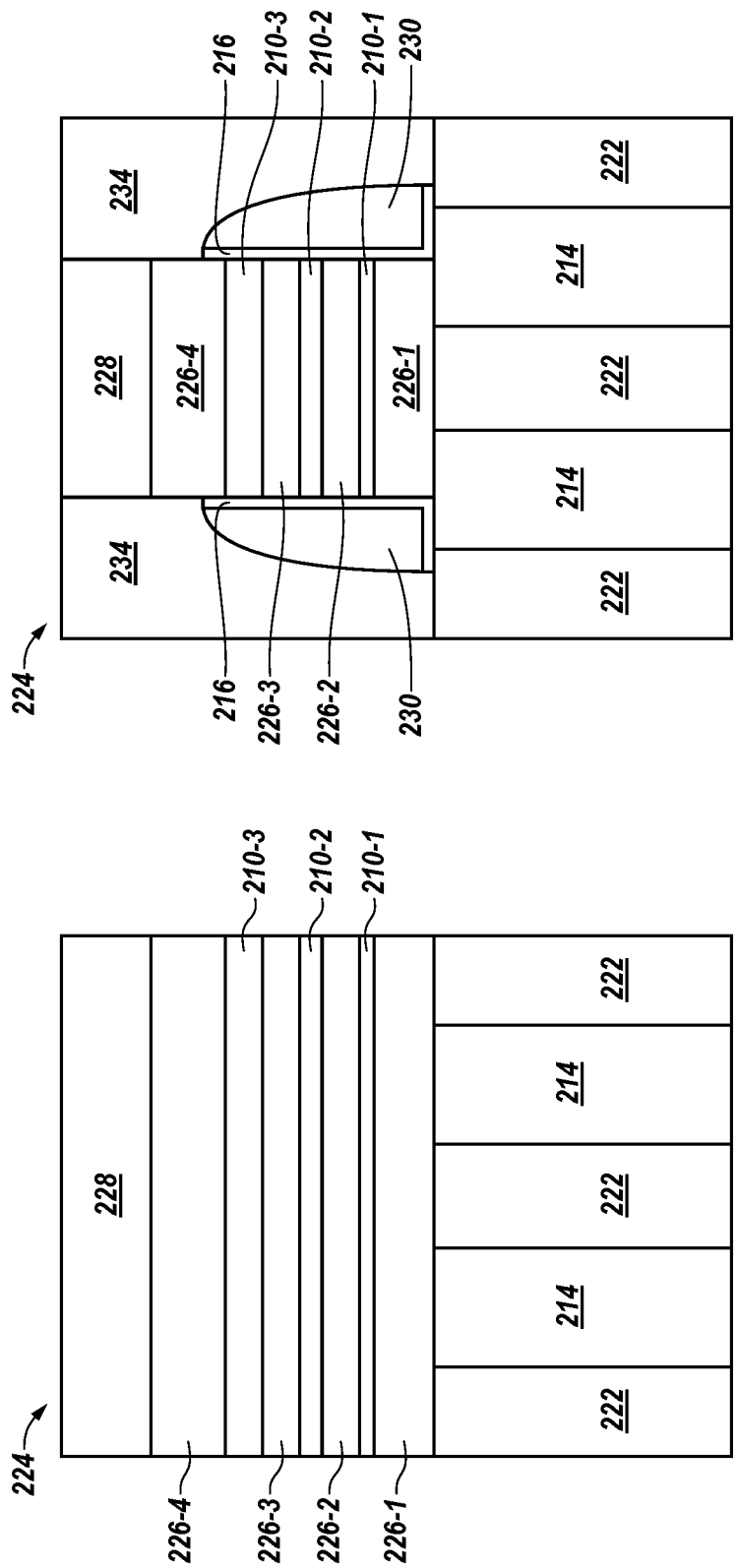

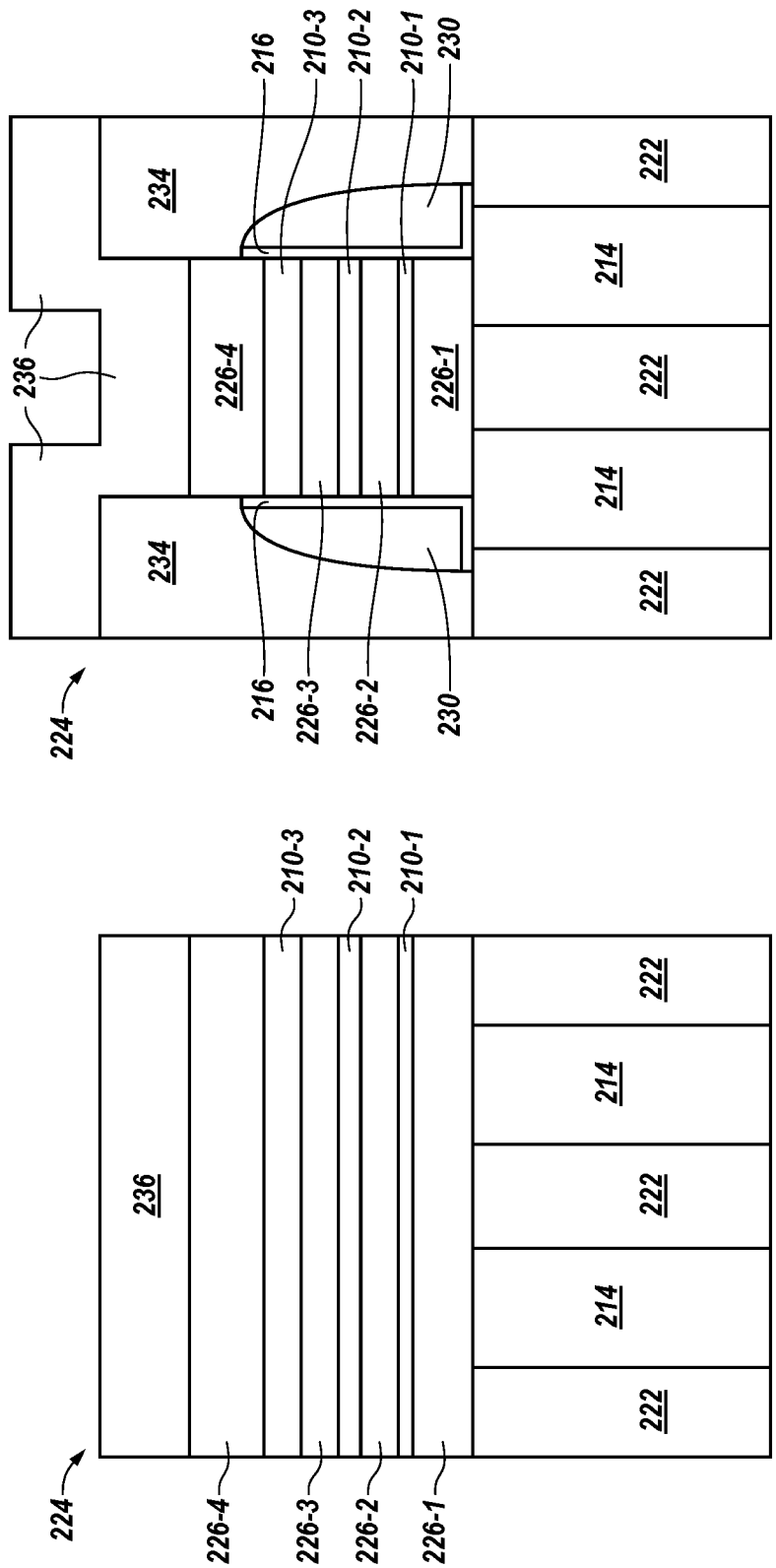

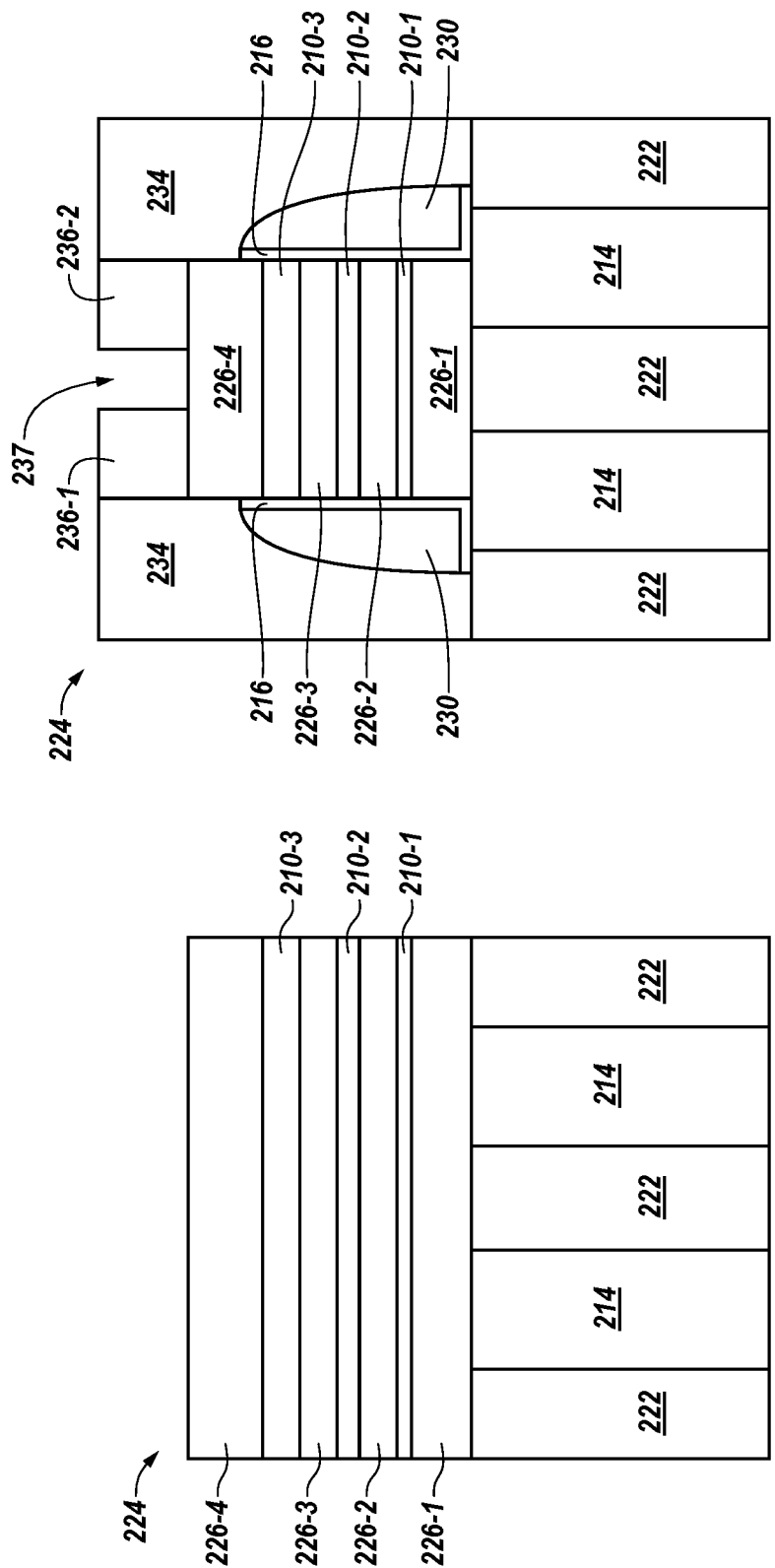

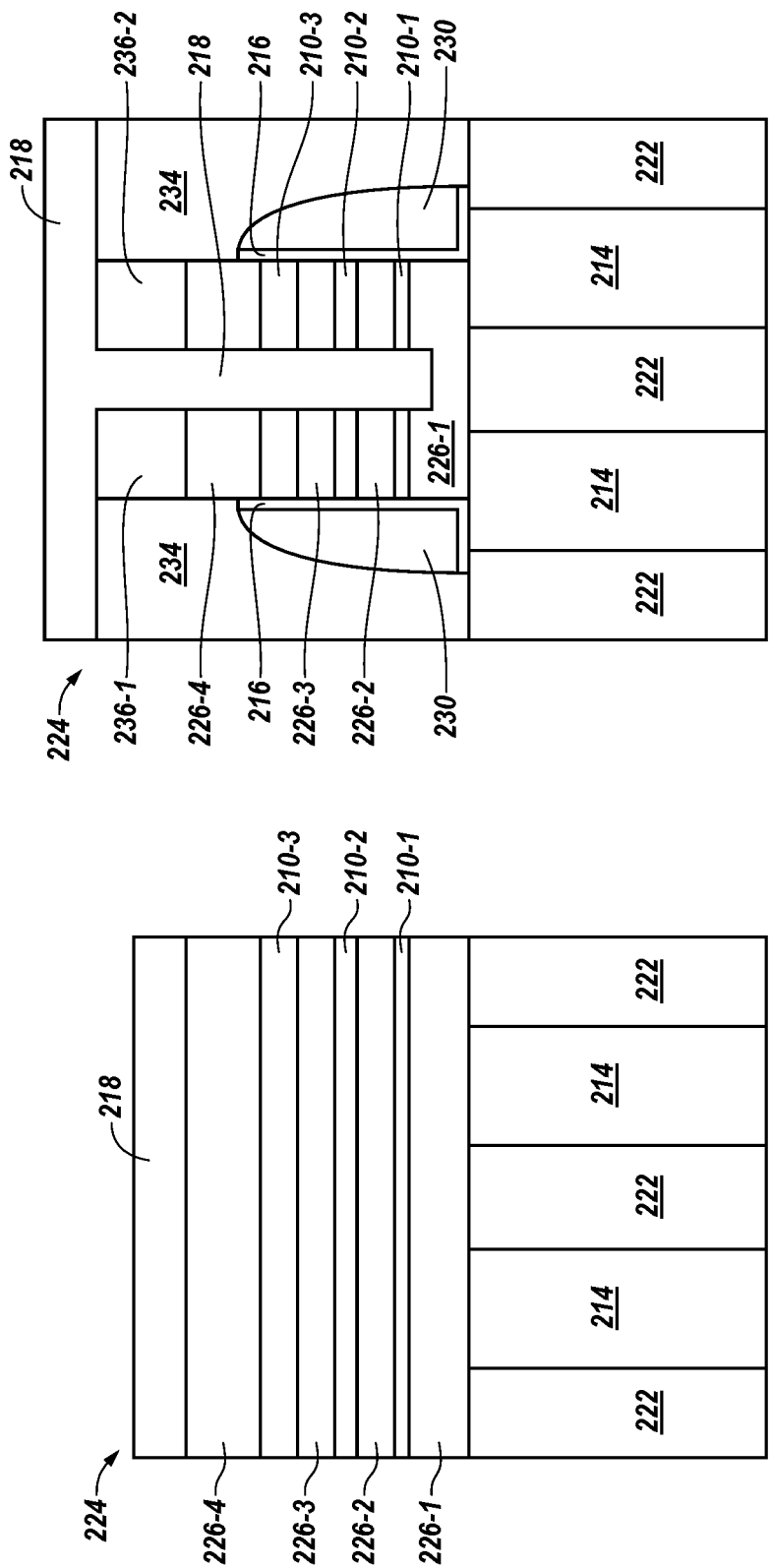

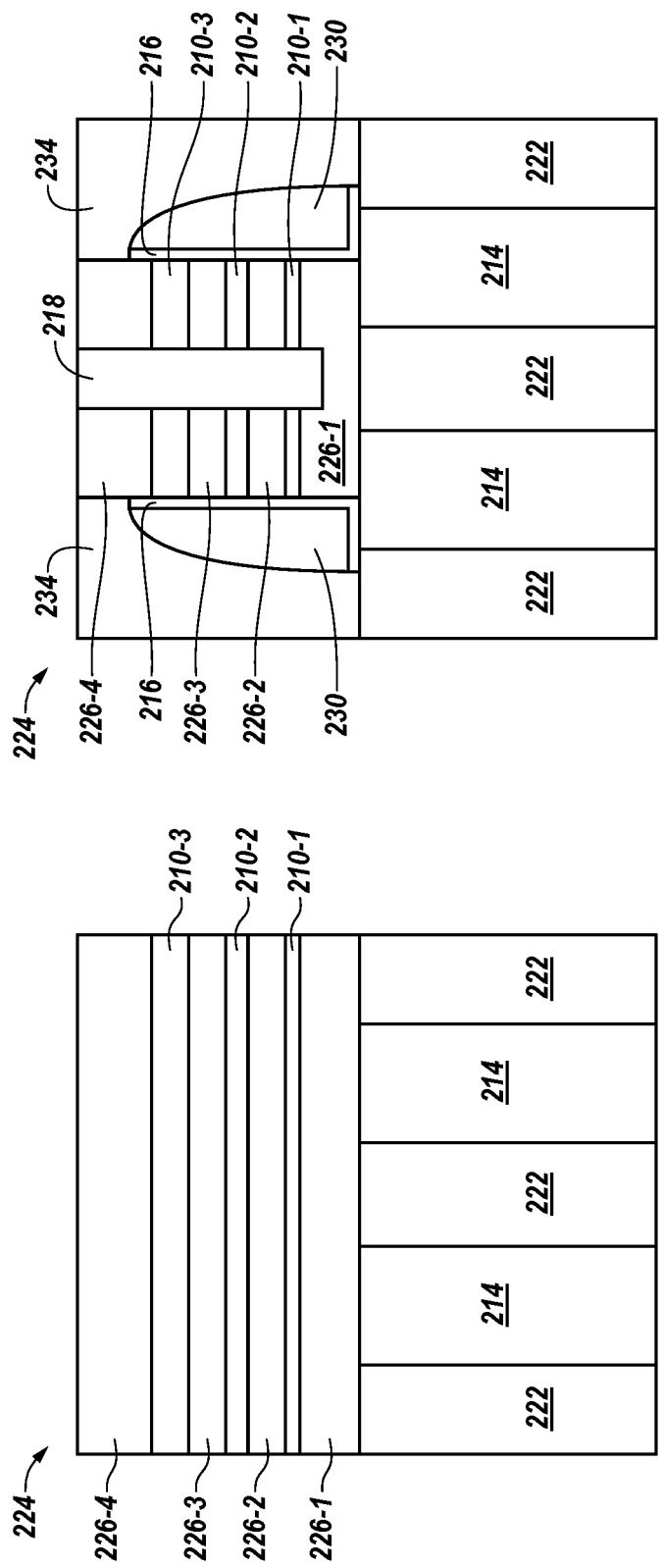

MEMORY CELLS HAVING A PLURALITY OF RESISTANCE VARIABLE MATERIALS

PRIORITY INFORMATION

This application is a Continuation of U.S. application Ser. No. 14/596,293 filed Jan. 14, 2015, which is a Divisional of U.S. application Ser. No. 13/570,772 filed Aug. 9, 2012, now U.S. Pat. No. 8,964,448, the specification of which is incorporated herein by reference.

TECHNICAL FIELD

The present disclosure relates generally to semiconductor memory apparatuses and methods, and more particularly to resistance variable memory cells having a plurality of resistance variable materials.

BACKGROUND

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, among others. Types of resistance variable memory include phase change random access memory (PCRAM) and resistive random access memory (RRAM), for instance.

Resistance variable memory devices, such as PCRAM devices, can include a resistance variable material, e.g., a phase change material, for instance, which can be programmed into different resistance states to store data. The particular data stored in a phase change memory cell can be read by sensing the cell's resistance e.g., by sensing current and/or voltage variations based on the resistance of the phase change material.

Some resistance variable memory cells can store multiple units, e.g., bits of data. Such memory cells can be referred to as multilevel cells. Multilevel memory cells can provide for increased storage capacity of a memory device, while providing for a decreased physical footprint as compared to memory devices having single level cells, among other benefits.

BRIEF DESCRIPTION OF THE DRAWINGS

FIGS. 2AX and 2AY illustrate cross-sectional views of a portion of an array of resistance variable memory cells in accordance with a number of embodiments of the present disclosure.

FIGS. 2BX-2IY illustrate various process stages associated with forming a resistance variable memory cell in accordance with a number of embodiments of the present disclosure.

DETAILED DESCRIPTION

Figure 1:
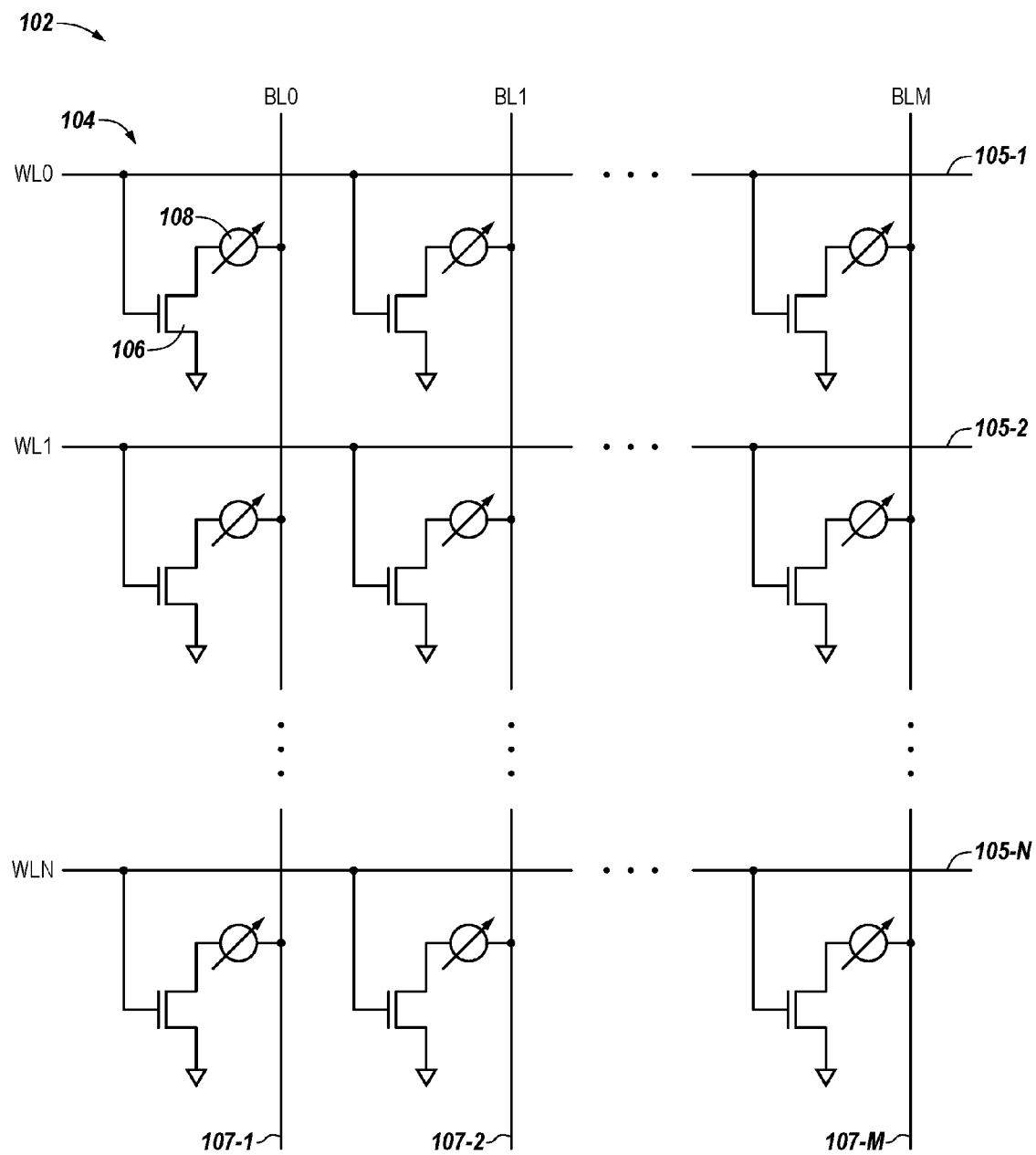
FIG. 1 is a schematic diagram of a portion of an array of resistance variable memory cells in accordance with a number of embodiments of the present disclosure.

Resistance variable memory cells having a plurality of resistance variable materials and methods of operating and forming the same are described herein. As an example, a resistance variable memory cell can include a plurality of resistance variable materials located between a plug material and an electrode material. The resistance variable memory cell also includes a first conductive material that contacts the plug material and each of the plurality of resistance variable materials and a second conductive material that contacts the electrode material and each of the plurality of resistance variable materials.

Embodiments of the present disclosure can provide multilevel resistance variable memory cells having a compact cell architecture. In a number of embodiments, the resistance variable memory cells can be vertically oriented and have a $4F^2$ architecture, with "F" corresponding to a minimum feature size. As such, embodiments can provide improved storage density and improved scalability as compared to previous approaches, among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 102 may reference element "2" in FIG. 1, and a similar element may be referenced as 202 in FIG. 2, e.g., FIG. 2AX. Also, as used herein, "a number of" a particular element and/or feature can refer to one or more of such elements and/or features.

FIG. 1 is a schematic diagram of a portion of an array 102 of resistance variable memory cells in accordance with a number of embodiments of the present disclosure. The array 102 includes a number of resistance variable memory cells 104, each including a select device 106 coupled to a resistance variable storage element 108. The memory cells 104 can be formed in accordance with embodiments described herein.

The resistance variable storage elements 108 can include a resistance variable material, e.g., a phase change material. The resistance variable material can be a chalcogenide e.g., a Ge—Sb—Te material such as $Ge_2Sb_2Te_5$, $Ge_1Sb_2Te_4$, $Ge_1Sb_4Te_7$, etc., among other resistance variable materials. The hyphenated chemical composition notation, as used herein, indicates the elements included in a particular mixture or compound, and is intended to represent all stoichiometries involving the indicated elements. Other resistance variable materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. In a number of embodiments, the resistance variable material can be a metal oxide material such as $TiO_2$, $La_2O_3$, $LaAlO_3$, $Ga_2O_3$, $ZrO_2$, $Zr_XSi_YO_Z$, $Zr_XTi_YO_Z$, $HfO_2$, $Hf_XTi_YO_Z$, $SrTiO_3$, LCMO, MgO, $Al_XO_Y$, $SnO_2$, $ZnO_2$, $Ti_XSi_YO_Z$, and/or a hafnium silicon oxide $Hf_XSi_YO_Z$, among other metal oxide materials.

The select devices 106 may be field effect transistors, e.g. metal oxide semiconductor field effect transistors (MOSFETs), a bipolar junction transistor (BJT) or a diode, among other types of select devices. Although the select device 106 shown in FIG. 1 is a three terminal select device, the select devices can be two terminal select devices, for instance.

In the example illustrated in FIG. 1, the select device 106 is a gated three terminal field effect transistor. As shown in FIG. 1, a gate of each select device 106 is coupled to one of a number of access lines 105-1, 105-2 . . . 105-N, e.g., each access line 105-1, 105-2, . . . 105-N is coupled to a row of memory cells 104. The access lines 105-1, 105-2, . . . 105-N may be referred to herein as "word lines." The designator "N" is used to indicate that the array 102 can include a number of word lines.

In the example illustrated in FIG. 1, each resistance variable storage element 108 is coupled to one of a number of data/sense lines 107-1, 107-2, . . . 107-M, e.g., each data line 107-1, 107-2, . . . 107-M is coupled to a column of memory cells 104. The data/sense lines 107-1, 107-2, . . . 107-M may be referred to herein as "bit lines." The designator "M" is used to indicate that the array 102 can include a number of bit lines. The designators M and N can have various values. For instance, M and N can be 64, 128, or 256. However, embodiments are not limited to a particular number of word lines and/or bit lines.

The select devices 106 can be operated, e.g., turned on/off, to select/deselect the memory cells 104 in order to perform operations such as data programming, e.g., writing, and/or data sensing, e.g., reading operations. In operation, appropriate voltage and/or current signals, e.g., pulses, can be applied to the bit lines and word lines in order to program data to and/or read data from the memory cells 104. As an example, the data stored by a memory cell 104 of array 102 can be determined by turning on a select device 106, and sensing a current through the resistance variable storage element 108. The current sensed on the bit line corresponding to the memory cell 104 being read corresponds to a resistance level of the resistance variable material of resistive storage element 108, which in turn may correspond to a particular data state, e.g., a binary value. The resistance variable memory array 102 can have an architecture other than that illustrated in FIG. 1, as will be understood by one of ordinary skill in the art.

In a number of embodiments of the present disclosure, the array 102 can have a $4F^2$ architecture, e.g. the resistance variable memory cells 104 of the array 102 can have a $4F^2$ footprint. Also, the resistance variable memory cells 104 may be vertical memory cells and can be formed, for instance, as described further herein, e.g., in connection with FIGS. 2B1-2I2.

The access lines and the data/sense lines can be coupled to decoding circuits formed in a substrate material, e.g, formed below the array and used to interpret various signals, e.g., voltages and/or currents, on the access lines and/or the data/sense lines. As an example, the decoding circuits may include row decoding circuits for decoding signals on the access lines, and column decoding circuits for decoding signals on the data/sense lines.

As used in the present disclosure, the term "substrate" material can include silicon-on-insulator (SOI) or silicon-on-sapphire (SOS) technology, doped and undoped semiconductors, epitaxial layers of silicon supported by a base semiconductor foundation, conventional metal oxide semiconductors (CMOS), e.g., a CMOS front end with a metal backend, and/or other semiconductor structures and technologies. Various elements, e.g., transistors, and/or circuitry, such as decode circuitry for instance, associated with operating the array 102 can be formed in/on the substrate material such as via process steps to form regions or junctions in the base semiconductor structure or foundation.

FIGS. 2AX and 2AY illustrate cross-sectional views of a portion of the array 202 of resistance variable cells in accordance a number of embodiments of the present disclosure. For FIGS. 2AX and 2AY, the "X" following the letter designation indicates a x-cut view, e.g., a view corresponding to a direction that is parallel with the data/sense lines 107-1, 107-2, . . . 107-M, discussed with FIG. 1. For FIGS. 2AX and 2AY, the "Y" following the letter designation indicates a y-cut view, e.g., a view corresponding to a direction that is parallel with the access lines 105-1, 105-2 . . . 105-N, discussed with FIG. 1.

As mentioned, the array 202 includes a number of resistance variable memory cells 204. FIGS. 2AX and 2AY illustrates portions of resistance variable memory cells 204-1 and 204-2. Each of the resistance variable memory cells 204-1 and 204-2 include a plurality of resistance variable materials 210-1, 210-2, 210-3, which serve as storage elements for the respective cells.

In a number of embodiments, the resistance variable materials 210-1, 210-2, 210-3 can be phase change materials, e.g., chalcogenides, which include a number of active regions representing portions of the resistance variable materials 210-1, 210-2, 210-3 that undergo phase transitions, e.g., from crystalline (low resistance) to amorphous (high resistance) and vice versa, in response to heating due to a current flow through the material, e.g., during memory cell operation.

In a number of embodiments, the resistance state associated with the memory cells 204-1 and 204-2 can depend on the phase of the respective active regions corresponding to resistance variable materials 210-1, 210-2, 210-3. For instance, a lowermost resistance associated with the resistance variable memory cells 204-1 and 204-2 can correspond to each of the active regions, e.g. of resistance variable materials 210-1, 210-2, and 210-3, being in a crystalline phase. An uppermost resistance associated with the resistance variable memory cells 204-1 and 204-2 can correspond to each of the active regions being in an amorphous phase. A first intermediate resistance associated with the resistance variable memory cells 204-1 and 204-2 can correspond to one of the active regions, e.g., associated with resistance variable material 210-1, being in an amorphous phase while the active regions associated with resistance variable materials 210-2 and 210-3 are in a crystalline phase, and a second intermediate resistance associated with the resistance variable memory cell 204 can correspond to two of the active regions, e.g., associated with resistance variable materials 210-1 and 210-2, being in an amorphous phase while the active region associated with resistance variable material 210-3 is in a crystalline phase. The different resistance states associated with resistance variable memory cells 204-1 and 204-2 can correspond to different data states, e.g., binary values, stored by resistance variable materials 210-1, 210-2, 210-3. For instance, the lowermost resistance state can correspond to binary "11", the uppermost resistance state can correspond to binary "00", and the intermediate resistance states can correspond to binary "10" and "01", respectively. Embodiments are not limited to these particular data assignments or to two bit memory cells. For instance, in a number of embodiments, each resistance variable memory cell can include more than three resistance variable materials such that the cells are programmable to have more than four different resistance states.

Each of the plurality of resistance variable materials 210-1, 210-2, 210-3 has a respective thickness 212. For instance, in the example illustrated in FIGS. 2AX and 2AY, resistance variable material 210-1 has a thickness 212-1, resistance variable materials 210-2 has a thickness 212-2, and resistance variable materials 210-3 has a thickness 212-3. As illustrated in FIGS. 2AX and 2AY each of the resistance variable materials 210 can have a different thickness 212. However, embodiments are not so limited. For example, a number of the resistance variable materials 210 can have a thickness that is the same as the thickness of another resistance variable material 210. In a number of embodiments, the resistance variable materials can have a same thickness but can be different resistance variable material or a same resistance variable material with a different stoichiometry.

The active regions associated with the resistance variable materials 210 may transition from a crystalline phase to an amorphous phase, for instance, responsive to an applied programming voltage, e.g., a voltage difference between a plug material and an electrode material, as discussed further herein. As discussed, each of the resistance variable materials 210 can have a different thickness 212, as such the active regions may transition from the crystalline phase to the amorphous phase, for instance, responsive to different applied programming voltages. For instance, an active region associated with the resistance variable material 210-3 having a greater thickness 212-3, as compared to the thicknesses 212-2 and 212-1 of resistance variable materials 210-2 and 210-1, may transition to an amorphous phase responsive to a relatively lower applied programming voltage than active regions associated resistance variable materials 210-2 and 210-1 having relatively lesser thicknesses 212-2 and 212-1.

As such, a programming voltage can be determined which is sufficient to effect transition of active region of resistance variable material 210-3 from a crystalline phase to an amorphous phase but which is insufficient to effect transition of active regions of resistance variable materials 210-2 and 210-1 to the amorphous phase. Similarly, a programming voltage can be determined which is sufficient to effect transition of active regions of resistance variable materials 210-3 and 210-2 from a crystalline phase to an amorphous phase but which is insufficient to effect transition of the active region of resistance variable material 210-1 to the amorphous phase. Also, a programming voltage can be determined which is sufficient to effect transition of each of the active regions of resistance variable materials 210-3, 210-2, and 210-1 from a crystalline phase to an amorphous phase. Additionally, a programming voltage can be determined which is insufficient to effect transition of the active regions of the resistance variable materials 210-3, 210-2, and 210-1 from a crystalline phase. The different programming voltages can be applied to cell 204 in order to program the cell 204 to one of a number of target data states, e.g., four data states (11, 10, 01, and 00) in this example. In accordance a number of embodiments of the present disclosure, a thickness 212 of a resistance variable material 210 may be a tuning parameter for the cell 204. For instance, the thicknesses 212-1, 212-2, 212-3 of the plurality of resistance variable materials 210-1, 210-2, 210-3 can be tuned to achieve different programming voltages necessary to induce a phase change of the active regions discussed herein. However, embodiments are not so limited. For example, in embodiments in which the resistance variable material includes a metal oxide, a programming voltage can be determined which is sufficient to cause ion, e.g., oxygen ion for metal oxide materials, vacancy movement. For example, a programming voltage can be determined which is sufficient to cause ion vacancy movement for resistance variable material 210-1, a programming voltage can be determined which is sufficient to cause ion vacancy movement for resistance variable materials 210-1 and 210-2, and a programming voltage can be determined which is sufficient to cause ion vacancy movement for resistance variable materials 210-1, 210-2, and 210-3.

Although the embodiment illustrated in FIGS. 2AX and 2AY illustrates a 2-bit memory cell 204, e.g., a cell programmable to four data states, embodiments are not so limited. For instance, the resistance variable memory cell 204 can include more (or less) than the three resistance variable materials 210-1, 210-2, 210-3. That is, the cell 204 can include additional resistance variable materials vertically spaced apart from the resistance variable materials 210-1, 210-2, 210-3. For instance, cell 204 could include seven resistance variable materials such that the cell is programmable to eight different data states, e.g., a 3-bit cell, or cell 204 could include two resistance variable materials such that the cell is a 1.5-bit cell. As such, the storage density of the cell 204 can be increased while maintaining a $4F^2$ footprint, for example. The additional resistance variable materials can have a thickness that is different than a number of the thicknesses 212-1, 212-2, 212-3. However, embodiments are not limited as such. For example, a number of the additional resistance variable materials can have a thickness that is the same as a number of the thicknesses 212-1, 212-2, 212-3.

As shown in FIGS. 2AX and 2AY, a resistance variable memory cell 204 can include a plug element, e.g., formed from a plug material 214. In a number of embodiments, the plug material 214 can be coupled to a select device corresponding to a resistance variable memory cell 204, e.g., a select device such as select device 106 shown in FIG. 1. In a number of embodiments, the plug material 214 can be a conductive material. However, embodiments are not so limited. For example, in a number of embodiments, the plug material 214 can be another material, such as silicon, among other materials.

As shown in FIGS. 2AX and 2AY, a resistance variable memory cell 204 can include a contact formed of a conductive material 216, e.g., a heater material. In accordance with a number of embodiments of the present disclosure, the conductive material 216 can be an L-shaped electrode, e.g., a heater electrode. For example, the conductive material 216 can have a first portion that is parallel to the plurality of resistance variable materials 210 and a second portion that is perpendicular to the plurality of resistance variable materials 210, e.g., the first portion of the conductive material 216 can be perpendicular to the second portion of the conductive material 216. As illustrated in FIG. 2AY, the conductive material 216 can contact, e.g., be formed on, the plug material 214. However, embodiments are not so limited. For example, another conductive material (not shown) can be formed between the conductive material 216 and the plug material 214. As illustrated in FIG. 2AY, the conductive material 216 contacts each of the plurality of resistance variable materials 210-1, 210-2, 210-3.

A resistance variable memory cell 204 can include a contact formed of a conductive material 218. As illustrated in FIG. 2AY, the conductive material 218 can contact each of the plurality of resistance variable materials 210-1, 210-2, 210-3 of a first cell 204-1 and each of the plurality of resistance variable materials 210-1, 210-2, 210-3 of a second cell 204-2. In other words, the conductive material 218 can be shared by two cells, e.g., cell 204-1 and adjacent cell 204-2, of the array 202.

In a number of embodiments, the resistance variable memory cell 204 can include an electrode element formed of an electrode material 220. As illustrated in FIG. 2AY, the electrode material 220 can be formed on, e.g., contact, the conductive material 218. As an example, the electrode material 220 can be, or can be coupled to, a conductive line such as a bit line, e.g., bit lines 107-1 to 107-M shown in FIG. 1.

Embodiments of the present disclosure are not limited to the physical structure of cell 204 shown in FIGS. 2AX and 2AY. For instance, in a number of embodiments, the structure of the plug material 214 and/or the electrode material 220 can be different. Also, contact locations of the plug material 214 and/or the electrode material 220 can be different, as well as a contact area between the conductive material 216 and resistance variable materials 210 and/or a contact area between the conductive material 218 and resistance variable materials 210.

FIGS. 2BX-2IY illustrate various process stages associated with forming a resistance variable memory cell in accordance with a number of embodiments of the present disclosure, e.g., a cell such as cells 204-1 and 204-2 described in the above discussion of FIGS. 2AX and 2AY. Similar to FIGS. 2AX and 2AY, for FIGS. 2BX-2Y2, the "X" following the letter designation indicates a x-cut view and the "Y" following the letter designation indicates a y-cut view. Embodiments are not so limited. For instance, the designator "X" could correspond to a y-cut view and the designator "Y" could correspond to an x-cut view.

The resistance variable memory cells can be formed using various processing techniques such as atomic material deposition (ALD), physical vapor deposition (PVD), chemical vapor deposition (CVD), supercritical fluid deposition (SFD), patterning, etching, filling, chemical mechanical planarization (CMP), combinations thereof, and/or other suitable processes. In accordance with a number of embodiments of the present disclosure, materials may be grown in situ.

In accordance with a number of embodiments of the present disclosure, a method of forming a resistance variable memory cell can include forming a plug material 214, as illustrated in FIGS. 2BX and 2BY. The plug material 214 may be a conductive material such as copper, platinum, tungsten, silver, titanium nitride, tantalum nitride, tungsten nitride, and/or ruthenium, among various other materials and/or combinations thereof. In a number of embodiments, the plug material 214 can be another material, such as silicon, among other materials.

The plug material 214 may be formed, e.g., patterned, on a dielectric material 222, which can be formed on a substrate material as discussed herein. In accordance with a number of embodiments of the present disclosure, dielectric material 222 can be a silicon oxide or silicon nitride, among other dielectric materials, for instance.

A material stack 224 can be formed on the plug material 214 and the dielectric material 222. The material stack 224 can include a number of alternating resistance variable materials 210 and dielectric materials 226, e.g., resistance variable material layers separated by dielectric material layers. The material stack 224, as shown in FIGS. 2BX and 2BY, includes resistance variable materials 210-1, 210-2, 210-3, which are separated by dielectric materials 226-2 and 226-3. Additionally, as shown in FIGS. 2BX and 2BY, the material stack 224 can include dielectric materials 212-1 and 212-4, which may be utilized to separate a number of the plurality of resistance variable materials 210 from another component of the resistance variable cell. For instance, as illustrated in FIGS. 2BX and 2BY, the dielectric material 226-1 separates the resistance variable material 210-1 from the plug material 214, e.g., the dielectric material 226-1 can be formed on the plug material 214 and resistance variable materials 210-1, 210-2, 210-3 can be formed on the dielectric material 226-1.

In accordance with a number of embodiments of the present disclosure, a mask material 228 can be formed on the material stack 224. For example, as illustrated in FIGS. 2BX and 2BY, the mask material 228 can be formed on the dielectric material 226-4. The mask material 228 can be a silicon nitride material, a polysilicon material, or other material suitable for serving as a mask material during a subsequent processing step.

FIGS. 2CX and 2CY illustrate the material stack 224 of FIGS. 2BX and 2BY at a subsequent processing stage. In FIGS. 2CX and 2CY portions of the material stack 224 have been removed, e.g., by patterning and etching the material stack 224. In accordance with a number of embodiments of the present disclosure, portions of the material stack 224 can be removed by a double pitch etch. For example, when F is a minimum printable line, a double pitch etch can be used to obtain 2F trenches and 2F lines. However, embodiments are not so limited.

FIGS. 2DX and 2DY illustrate the formation of conductive elements 216, e.g., heater electrodes, subsequent to the processing shown in FIGS. 2CX and 2CY. The conductive elements 216 can be formed, for instance, by a conformal deposition of a conductive material over the structure of FIGS. 2CX and 2CY, such that the conductive material contacts the plug material 214 and each of the plurality of resistance variable materials 210-1, 210-2, 210-3. The conductive material 216 can be formed of various conductive materials such as titanium, titanium nitride, silicon carbide, graphite, tantalum nitride, tantalum-aluminum nitride, tungsten nitride, for instance, and/or combinations thereof.

As illustrated in FIG. 2DY, a spacer material 230 can be formed on the conductive material 216. The spacer material 230 can be silicon oxide or silicon nitride, among other spacer materials for instance. Following formation of the spacer material, portions of the conformally formed conductive material, e.g., conductive material 216, and spacer material 230 are removed, e.g., by etching, which separates the conductive material 216 in the bit line direction. For example, as shown in FIG. 2DY, the spacer material 230 and conductive material 216 are recessed by an amount 232 below an upper surface of dielectric material 226-4.

FIGS. 2EX and 2EY illustrate the structure shown in FIGS. 2DX and 2DY after a filling process and a planarization process is performed, in which a dielectric material 234 is formed over the structure. For example, the dielectric material 234 can be formed on the spacer material 230, the dielectric materials 222 and 226-4, and the mask material 228. In accordance with a number of embodiments of the present disclosure, a planarization process, e.g., CMP, may be performed following formation of the dielectric material 234.

Subsequent to the planarization, for example, the first mask material 228 can be removed and a second mask material 236 can be formed on the dielectric material 226-4 and the dielectric material 234, as illustrated in FIG. 2FY. Thereafter, portions of the mask material 236 can be removed, e.g., by etching, as illustrated in FIGS. 2GX and 2GY to form spacers 236-1 and 236-2. The spacers 236-1 and 236-2 define a width of an opening 237. An etch process can then be performed to remove portions of dielectric materials 226-4, 226-3, 226-2, and 226-1 and portions of resistance variable materials 210-3, 210-2, and 210-1 to form a trench (not shown) having a same width as that defined by opening 237.

A conductive material 218, as illustrated in FIG. 2HY can be formed in the trench, as well as on portions of the mask material 236 and the dielectric material 234. The conductive material 218 can contact each of the resistance variable materials, e.g., resistance variable materials 210-1, 210-2, 210-3, and each of the dielectric materials, e.g., 226-1, 226-2, 226-3, 226-4. In accordance with a number of embodiments of the present disclosure, the conductive material 218 can be a composite of more than a single material, e.g., it can include a barrier (or sidewall) material and a core material.

As illustrated in FIGS. 2IX and 2IY, a portion of the conductive material 218, the mask material 236, and the dielectric material 234 can be removed, e.g., by etching and/or CMP. As shown in FIGS. 2AX and 2AY, a conductive material 220 can be formed on the structure shown in FIGS. 2IX and 2IY. The conductive material 220 can serve as and electrode corresponding to the memory cell. In a number of embodiments, material 220 can serve as a conductive line, e.g., a bit line, of the cell. The conductive material 218 in the trench can serve as a conductive contact between the resistance variable materials 210-1, 210-2, 210-3 of the cells 204-1 and 204-2 and the electrode material 220.

The electrode material 220 can be formed by a damascene process, for example, among other processes. The electrode material 220 can be copper, platinum, tungsten, silver, aluminum, titanium nitride, tantalum nitride, tungsten nitride, and/or ruthenium, among various other materials and/or combinations thereof. Also, as shown in FIG. 2AX, an etch can be performed in the y-direction to define individual cells and to define individual conductive lines, e.g., bit lines, of the array.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method comprising:
    applying a first signal to an access line of an array to program a group of memory cells to respective targets data states of a plurality of data states, wherein each memory cell of the group respectively comprises:
    a plurality of storage materials each including a respective active region formed between a plug material and an electrode material, wherein at least two of the plurality of storage materials have different thicknesses, and the first signal transitions a first active region of the plurality of storage materials;
    a conductive material that contacts the electrode material and each of the plurality of storage materials; and
    a heater material that contacts the plug material and each of the plurality of storage materials.

2. The method of claim 1, including applying a second signal to the access line to transition a second active region of the plurality of storage materials.

3. The method of claim 2, wherein transitioning the second active region of the plurality of storage materials programs the group of memory cells to a different target data state.

4. The method of claim 3, including applying a third signal to the access line to transition a third active region of the plurality of storage materials.

5. The method of claim 4, wherein transitioning the third active region of the plurality of storage materials programs the group of memory cells to another different target data state.

6. The method of claim 5, including applying a fourth signal to the access line to transition the first active region, the second active region, and the third active region of the plurality of storage materials.

7. The method of claim 6, wherein transitioning the first active region, the second active region, and the third active region of the plurality of storage materials programs the group of memory cells to a further different data state.

8. The method of claim 7, wherein each of the plurality of resistance variable materials respectively include an active region that transitions from a crystalline phase to an amorphous phase.

9. A method comprising:
    programming a group of memory cells of an array to respective data states, wherein each cell of the group includes a resistance variable storage element comprising a plurality of resistance variable materials,
    wherein the plurality of resistance variable materials are formed between a plug material and an electrode material,
    wherein each cell of the group includes a conductive material that contacts the electrode material and each of the plurality of resistance variable materials, and
    wherein each cell of the group includes a heater material that contacts the plug material and each of the plurality of resistance variable materials.

10. The method of claim 9, wherein the group of cells are common to a row of the array.

11. The method of claim 9, wherein the number of cells are common to a column of the array.

12. The method of claim 9, wherein the plurality of resistance variable materials includes a first resistance variable material, a second resistance variable material, and a third resistance variable material.

13. The method of claim 12, wherein the first resistance variable material has a thickness greater than the second resistance variable material.

14. The method of claim 12, wherein the second resistance variable material has a thickness greater than the third resistance variable material.

15. A method comprising:
turning on a group of select devices corresponding to a respective group of memory cells of an array of memory cells, wherein each cell comprises a resistance variable storage element comprising a plurality of resistance variable materials,
wherein the plurality of resistance variable materials are formed between a plug material and an electrode material,
wherein each cell of the group includes a conductive material that contacts the electrode material and each of the plurality of resistance variable materials, and
wherein each cell of the group includes a heater material that contacts the plug material and each of the plurality of resistance variable materials; and
sensing a current through the respective resistance variable storage elements of the group of memory cells to determine a respective resistance level of the cells.

16. The method of claim 15, wherein a first resistance level is a lowermost resistance corresponding to a first data state.

17. The method of claim 16, wherein a second resistance level is a first intermediate resistance corresponding to a second data state.

18. The method of claim 17, wherein a third resistance level is a second intermediate resistance corresponding to a third data state.

19. The method of claim 18, wherein a fourth resistance level is an uppermost resistance state corresponding to a fourth data state.

20. The method of claim 19, wherein the first data state, the second data state, the third data state, and the fourth data state are selected from the group comprising 00, 01, 10, and 11.

* * * * *